United States Patent [19]
Judell

[11] 4,219,879
[45] Aug. 26, 1980

[54] DIGITAL TO ANALOG CONVERSION SYSTEM

[75] Inventor: Neil H. K. Judell, North Kingston, R.I.

[73] Assignee: Hewlett-Packard Company, Palo Alto, Calif.

[21] Appl. No.: 940,250

[22] Filed: Sep. 7, 1978

[51] Int. Cl.² ............ G06G 7/12; G06J 1/00; H03K 13/02
[52] U.S. Cl. .................. 364/602; 340/347 M
[58] Field of Search .......... 364/602, 605, 724; 340/347 M; 325/42; 333/18

[56] References Cited

U.S. PATENT DOCUMENTS 4,071,827  1/1978  Koike et al. .......... 333/18 X

Primary Examiner—Jerry Smith
Attorney, Agent, or Firm—Donald N. Timbie

[57] ABSTRACT

A digital signal is summed before application to a D/A converter, and a differentiator is inserted at some point between the signal input and output.

6 Claims, 31 Drawing Figures

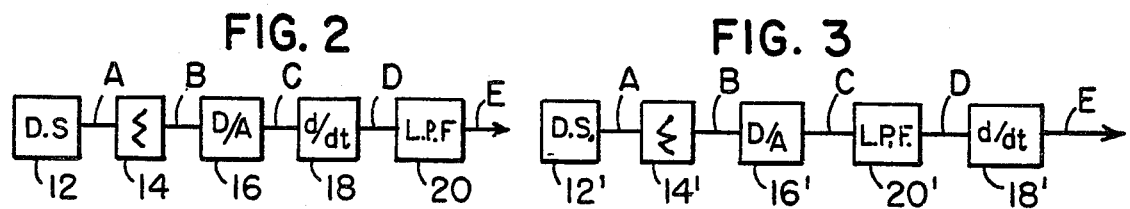
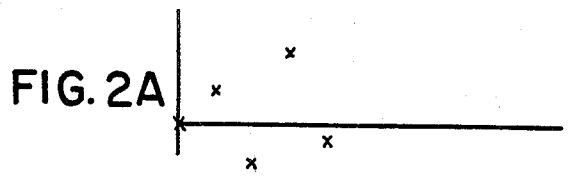 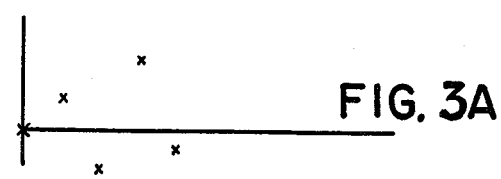
FIG. 2A   FIG. 3A
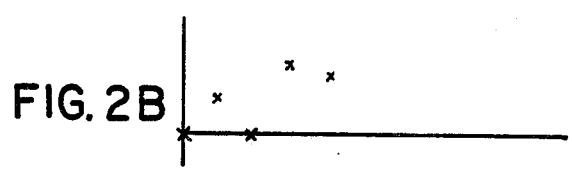 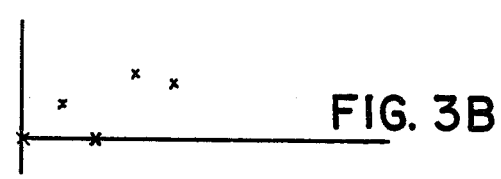
FIG. 2B   FIG. 3B
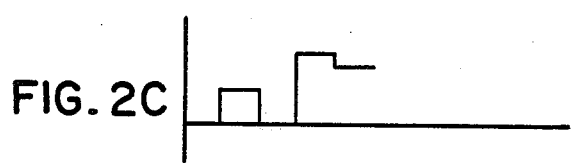 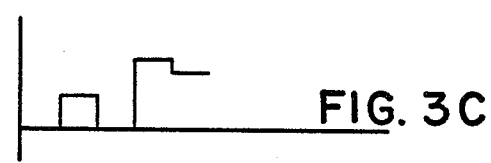
FIG. 2C   FIG. 3C
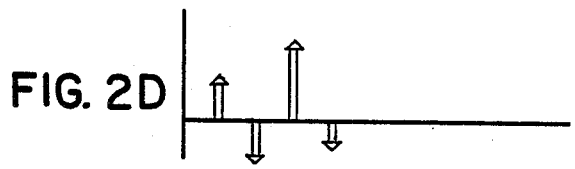 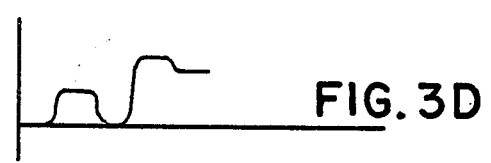
FIG. 2D   FIG. 3D
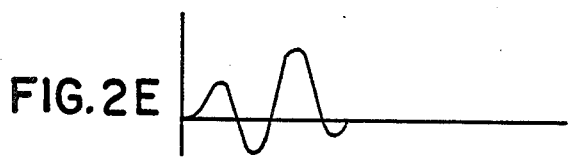 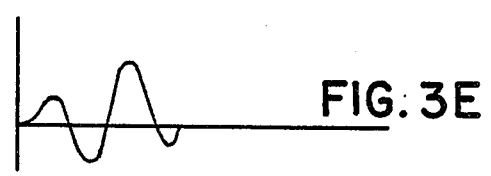
FIG. 2E   FIG. 3E 4,219,879

DIGITAL TO ANALOG CONVERSION SYSTEM

BACKGROUND OF THE INVENTION

In many types of apparatus, analog signals are converted into digital signals by analog-to-digital converters known as A/D's. After the digital signals are processed, the results are converted to an output signal in analog form by a digital-to-analog converter known as a D/A and a low pass filter. The digital signals are formed at a sampling rate $1/t_0$ that is at least twice the highest analog signal frequency of interest. Whereas this method of recovering the output analog signal works in a satisfactory manner for most applications, it introduces objectionable distortion in applications where extreme accuracy is desired. This arises from the fact that in accordance with the Nyquist theorem, the low pass filter will produce the desired analog output signal with precision only if the signal samples applied to it have zero width, i.e., if they are a series of Dirac delta functions. However, most practicable D/A converters output a stepped wave having the height of each sample until the next sample is received $t_0$ seconds later. This is equivalent to convolving the narrow pulses required by the Nyquist theorem with a rectangular pulse. Fourrier analysis indicates that such a pulse has a $\sin \omega t/\omega$ distribution of frequency components so that the convolution causes an output signal $0(\omega)$ in the frequency domain as indicated by the following expression, wherein H is the desired signal and $t_0$ is the width of a step or the time between samples:

$$O(\omega) = 2H(\omega)e^{-j\omega t_0/2} \frac{\sin \omega t_0/2}{\omega} \quad (1)$$

The factor $(\sin \omega t_0/2)/\omega$ causes the distortion referred to.

BRIEF DESCRIPTION OF THE INVENTIVE CONCEPT

Narrow pulses could be formed by differentiating the stepped wave at the output of a D/A converter but, for reasons that will be explained, they will not produce the desired analog signal when applied to a low pass filter. If, however, in accordance with the invention, the digital signals are summed before application to the D/A converter, it will produce a stepped wave that can theoretically be differentiated so as to create pulses that will produce the correct analog signal at the output of the low pass filter. The fact that practicable differentiating means may not produce sufficiently narrow pulses, especially at high frequencies, presents no problem because the differentiating means may be placed after the low pass filter rather than ahead of it. This can be done because the convolution of the stepped signals through the filter and the differentiating means in sequence produces the same output regardless of their order in the sequence. And, as will be explained, as long as the manipulation of the digital signals is linear, the differentiating means may be inserted ahead of the summer, for once again the convolution is the same regardless of the order. In order that the summer not be required to exceed the maximum number it can obtain, it is essential that the signal applied to it be devoid of DC content. Various techniques, including AC coupling, can be used to eliminate the DC content represented by the signal applied to the summer.

THE DRAWINGS

FIG. 2 is a block diagram of apparatus for theoretically producing an analog wave from a digital signal in accordance with this invention;

FIG. 2A illustrates the amplitude of samples represented by arbitrarily selected digital signals that are to be converted into an analog wave;

FIGS. 2B, 2C, 2D and 2E are waves appearing at corresponding points in FIG. 2;

FIG. 3 is a block diagram of practical apparatus for producing an analog wave from a digital signal in accordance with this invention;

FIG. 3A is the same as FIG. 2A and illustrates the sample amplitudes represented by an arbitrarily selected digital signal to be converted into an analog wave;

FIGS. 3B and 3C are waves appearing at corresponding points in FIG. 3 and are the same as the waves of FIGS. 2B and 2C respectively;

Figure 4:
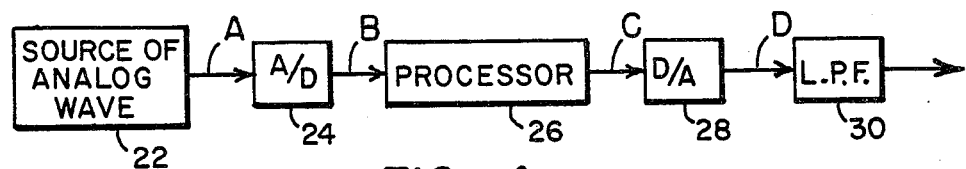
Figure 5:
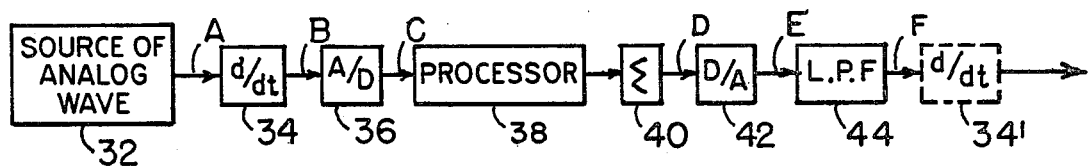
Figure 5A:
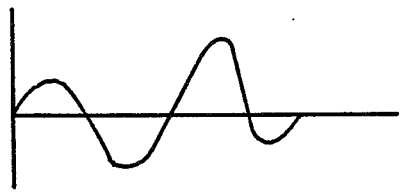

FIGS. 3D and 3E appear at corresponding points in FIG. 3;

FIG. 4 is a block diagram of a classical prior art apparatus for converting an analog signal to digital form for linear processing and recovering therefrom the resulting analog wave;

FIGS. 4A, 4B, 4C and 4D illustrate waves appearing at corresponding points in FIG. 4;

FIG. 5 is a block diagram of apparatus designed in accordance with this invention for converting an analog signal to digital form for linear processing and recovering therefrom the resulting analog wave; and FIGS. 5A, 5B, 5C, 5D, 5E and 5F are waveforms that may appear at corresponding points in FIG. 5.

Figure 1:
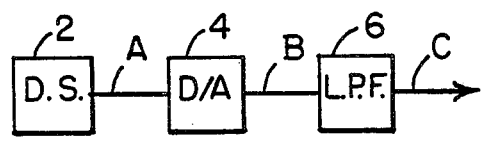
FIG. 1 is a block diagram of classical prior art apparatus for producing an analog wave from a digital signal.
Figure 1A:
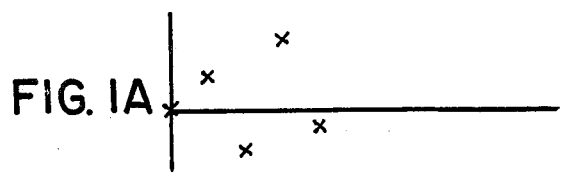
FIG. 1A illustrates the amplitude represented by successive samples of a digital signal.
Figure 1B:
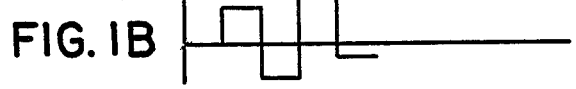
FIGS. 1B and 1C illustrate waves appearing at corresponding points in FIG. 1.

In the classical prior art apparatus shown in FIG. 1, a source 2 of digital signals is coupled to the input of a D/A converter 4, and its output is coupled to a low pass filter 6. The digital words appear at the output of the source 2 at uniformly spaced sampling times and may, for example, represent amplitudes such as illustrated in FIG. 1A. After each digital sample word, the D/A converter 4 outputs a voltage having the amplitude represented by that sample until the next sample is received as indicated by the stepped wave of FIG. 1B. When the wave is applied to the low pass filter 6, it outputs an analog wave such as shown in FIG. 1C.

Figure 1D:
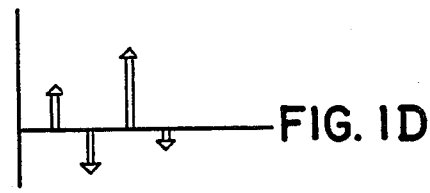
FIG. 1D illustrates the Nyquist samples that are to be applied to the input of a low pass filter to produce at its output a signal corresponding to the amplitude shown in FIG. 1A.
Figure 1C:
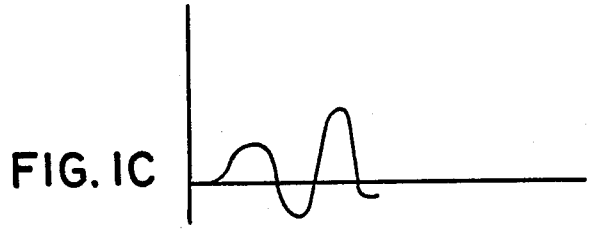
Figure 1E:
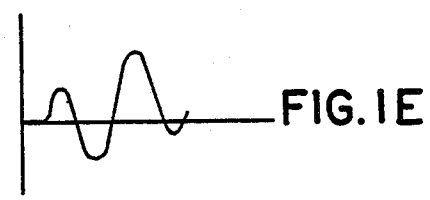
FIG. 1E illustrates a desired signal corresponding to the amplitude shown in FIG. 1A.
Figure 1F:
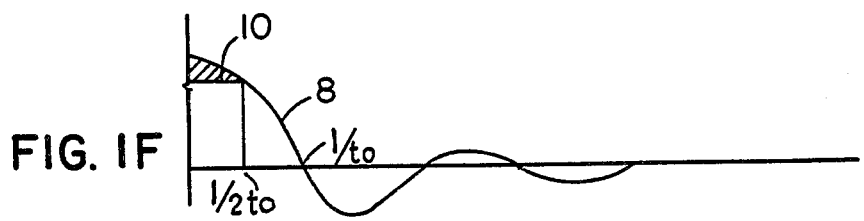
FIG. 1F illustrates the distortion produced by the prior art apparatus of FIG. 1.

The pulses shown in FIG. 1D are Nyquist pulses having the amplitudes of the samples indicated in FIG. 1A. If such pulses were applied to the low pass filter 6, its output would be as indicated in FIG. 1E and would be free of distortion. A comparison of the wave of FIG. 1E and that of FIG. 1C shows that the latter is delayed by $T_0/2$. The wave of FIG. 1C would also be distorted in shape, but this is difficult to show. The source of the distortion can be understood by examination of FIG.

1F. The wave 8 indicates the Sin ω/ω frequency response introduced by the stepped wave output of the D/A converter 4 wherein ½t₀ indicates the Nyquist frequency. If the low pass filter 6 cuts off at this frequency, the distortion is indicated by the shaded area 10.

FIG. 2 is a block diagram of a system embodying the invention but based on the assumption that a differentiator can produce sufficiently narrow pulses from a stepped wave applied to it. Digital signals representing no direct current component are supplied by a source 12 and are summed in a summer 14 before being applied to a D/A converter 16. Its output is differentiated in a differentiator 18 and applied to a low pass filter 20. The samples of FIG. 2A are the same as those of FIG. 1A and are represented by successive words at the output of the digital source 12. The amplitudes represented by these words are summed in the summer 14 so as to produce digital words representing amplitudes indicated in FIG. 2B. The practical D/A converter 16 produces the stepped wave shown in FIG. 2C at point C in FIG. 2. Notice that this wave is such that when it is differentiated by the differentiator 18 it will produce pulses at point D that are illustrated in FIG. 2D. It will be observed that these pulses are the same as those of FIG. 1D, i.e., those required by the Nyquist theorem. Accordingly, the output of the low pass filter 20 is an undistorted wave as indicated in FIG. 2E, which, of course, is the same as the wave of FIG. 1E.

In view of the fact that practical differentiators cannot produce sufficiently narrow pulses such as represented in FIG. 2D, the output wave of FIG. 2E would be distorted. However, as indicated in FIG. 3, this difficulty can be overcome by simply reversing the order of the differentiator and the low pass filter. The blocks of FIG. 3 that correspond to those of FIG. 2 are indicated by the same numerals primed. FIGS. 3A, 3B and 3C correspond respectively to FIGS. 2A, 2B and 2C. The output of the low pass filter 20' is indicated in FIG. 3D, and the output signal from the differentiator 18' is indicated in FIG. 3E. This is, of course, the same as FIG. 2E.

Without the summer 14 in FIGS. 2 and 3, the output of the D/A's 16 and 16' would be the same as shown in FIG. 1B. Differentiation of this wave would not produce the required Nyquist pulses that are proportional to the height of each sample of FIGS. 2A and 3A, but rather it would produce pulses equal to the amplitude difference between successive samples. The summer 14 produces the stepped wave of FIGS. 2C and 3C that can be differentiated to produce the required pulses.

Figure 4A:
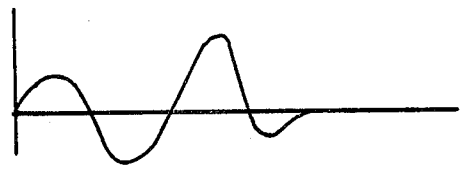
Figure 4B:
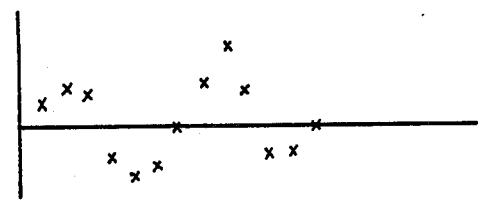
Figure 4C:
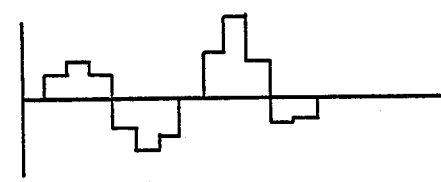
Figure 4D:
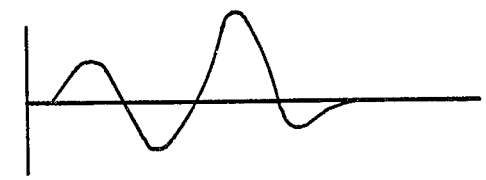

FIG. 4 is the block diagram of a prior art concept that processes an analog signal after converting it to its digital form and converts the result back into analog form. The waves shown in FIGS. 4A, 4B, 4C and 4D appear at or relate to the points of FIG. 4 indicated by the same letters. A source 22 of analog waves, such as illustrated in FIG. 4A, is coupled to an A/D converter 24 which outputs periodic digital samples representing the amplitudes shown in FIG. 4B. Whereas the digital signal can be processed in a processor 26, it will be assumed for the purpose of explanation that the processor does not alter the signal. The D/A converter 28 will put out a stepped wave such as shown in FIG. 4C. Application of this wave to a low pass filter 30 causes it to output a wave that should be the same as the input analog wave of FIG. 4A. Note, however, that it is delayed by t₀/2. The wave of FIG. 4D will also be distorted in shape, but this is difficult to illustrate.

Figure 5B:
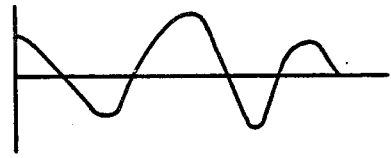
Figure 5C:
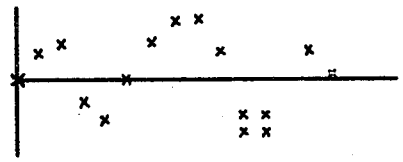
Figure 5D:
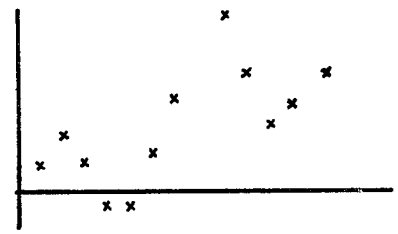
Figure 5E:
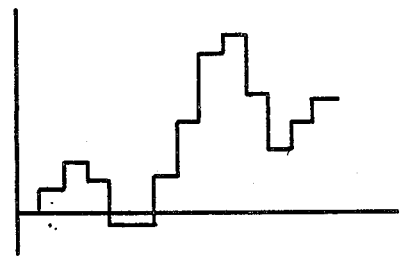
Figure 5F:
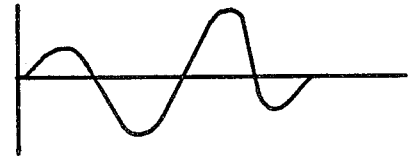

Consider now the block diagram of FIG. 5 that represents a circuit performing the same overall function as FIG. 4. By incorporating this invention, however, the delay and distortion previously referred to are avoided. FIGS. 5A, 5B, 5C, 5D, 5E and 5F illustrate waves that appear at or relate to correspondingly lettered points in FIG. 5. Assume that a source 32 of analog signals supplies an analog signal shown in FIG. 5A that is the same as the analog signal of FIG. 4A. This signal is differentiated in a differentiator 34 so as to produce a signal such as illustrated in FIG. 5B. An A/D converter 36 that is coupled to the output of the differentiator 34 provides digital samples corresponding to sample amplitudes shown in FIG. 5C. In order to illustrate the operation of FIG. 5, it is assumed that the processor 38 coupled the digital signals it receives from the A/D converter 36 to a summer 40. The summer 40 will then output digital samples representing the sum of the amplitudes shown in FIG. 5C, the result being digital signals that represent the amplitudes illustrated in FIG. 5D. A D/A converter 42 then outputs the stepped wave shown in FIG. 5E. The output of the low pass filter 44 to which this wave is applied will be as illustrated in FIG. 5F and will be distortionless so as to be the same as the original analog wave of FIG. 5A.

In the embodiment of the invention shown in FIG. 5, the differentiator 34 is located at a point ahead of the summer 40. It could, of course, be located at a point following the low pass filter 44, as indicated by the dashed rectangle 34', but in this case, FIG. 5 would correspond to FIG. 3.

The processor 38 of FIG. 5 has been assumed to produce no change in the digital signals applied to it, but it is to be understood that it can modify these digital signals as desired as long as the modification is linear and as long as it is devoid of DC without affecting the advantages attained by the invention. Thus, the differentiator can be ahead of the summer.

What is claimed is:

1. A system for processing first analog signals comprising
    an analog-to-digital converter,
    a digital processor coupled to said converter,
    a digital summer coupled to receive the digital output of said processor,
    a digital-to-analog converter coupled to the outputof said summer for producing second analog signals, and
    means for differentiating one of said first and second analog signals.

2. A system for converting a digital signal to an analog signal comprising
    a summer to which the digital signal to be converted to analog form may be applied,
    a digital-to-analog converter coupled to the output of said summer, and
    a low pass filter and an analog differentiator coupled in series to the output of said digital-to-analog converter.

3. A system for processing time-varying analog signals in digital form and producing the results in analog form, comprising
    a terminal to which an analog signal may be applied,
    an analog-to-digital converter having an input coupled to said terminal and having an output, a digital processor having an input coupled to the output of said analog-to-digital converter and having an output, a digital summer having an input coupled to the output of said digital processor, and having an output, a digital-to-analog converter having an input coupled to the output of said summer and having an output, a low pass filter coupled to the output of said digital-to-analog converter, and means for differentiating the signals in the system when they are in analog form.

4. A system as set forth in claim 3 wherein said analog-to-digital converter and said digital-to-analog converter operate at a given sampling frequency and wherein said low pass filter attenuates frequencies above one-half of said sampling frequency.

5. A system as set forth in claim 3 wherein said processor is linear and said means for differentiating is coupled between said terminal and the input of said analog-to-digital converter.

6. A system as set forth in claim 3 wherein said means for differentiating is connected in series with said low pass filter to the output of said digital-to-analog converter.

* * * * *